United States Patent
Cai et al.

(10) Patent No.: US 9,742,382 B2
(45) Date of Patent: Aug. 22, 2017

(54) FLIP-FLOP FOR REDUCING DYNAMIC POWER

(71) Applicant: QUALCOMM INCORPORATED, San Diego, CA (US)

(72) Inventors: Yanfei Cai, Shanghai (CN); Qiang Dai, Shanghai (CN); Shuangqu Huang, Shanghai (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/783,761

(22) PCT Filed: May 8, 2013

(86) PCT No.: PCT/CN2013/075309
§ 371 (c)(1),
(2) Date: Oct. 9, 2015

(87) PCT Pub. No.: WO2014/179944
PCT Pub. Date: Nov. 13, 2014

(65) Prior Publication Data
US 2016/0056801 A1    Feb. 25, 2016

(51) Int. Cl.
H03K 3/037   (2006.01)
H03K 3/3562  (2006.01)
H03K 3/012   (2006.01)

(52) U.S. Cl.
CPC ......... *H03K 3/35625* (2013.01); *H03K 3/012* (2013.01)

(58) Field of Classification Search
USPC ........ 327/199–200, 202, 210–212, 215, 218
See application file for complete search history.

(56) References Cited

U.S. PATENT DOCUMENTS

| 5,239,206 A    | 8/1993 | Yanai   |           |
|----------------|--------|---------|-----------|
| 6,208,188 B1 * | 3/2001 | Shionoya | H03K 3/012 |
|                |        |         | 327/215   |

(Continued)

FOREIGN PATENT DOCUMENTS

| CN | 101079614 A | 11/2007 |
| CN | 102215033 A | 10/2011 |

(Continued)

OTHER PUBLICATIONS

International Search Report and Written Opinion—PCT/CN2013/075309—ISA/EPO—Feb. 20, 2014.

(Continued)

*Primary Examiner* — An Luu
(74) *Attorney, Agent, or Firm* — Paradice and Li LLP/Qualcomm

(57) ABSTRACT

A flip-flop circuit may include a first latch and a second latch. The first latch, which may operate as a "master" latch, includes a first input terminal to receive a data signal, a second input terminal to receive a clock signal, and an output terminal. The second latch, which may operate as a "slave" latch, includes a first input terminal connected directly to the output terminal of the first latch, a second input terminal to receive the clock signal, and an output terminal to provide an output signal. The first latch and the second latch are to be clocked on the same phase of the clock signal, thereby eliminating the need to include clock inversion circuits that generate complementary clock signals.

20 Claims, 7 Drawing Sheets

(56) References Cited

U.S. PATENT DOCUMENTS

| | | | |
|---|---|---|---|
| 6,930,950 B2* | 8/2005 | Kinoshita | G11C 7/12 365/203 |
| 7,193,444 B1* | 3/2007 | Karabatsos | H03K 3/037 326/44 |
| 7,233,184 B1 | 6/2007 | Nguyen | |
| 7,265,599 B1 | 9/2007 | Pasqualini | |
| 8,103,941 B2* | 1/2012 | Naffziger | H03K 3/037 365/154 |
| 8,472,515 B1* | 6/2013 | Savoj | H04L 25/03057 327/157 |
| 8,570,086 B2* | 10/2013 | Hirairi | G11C 19/00 327/212 |
| 2004/0027184 A1 | 2/2004 | Araki | |

FOREIGN PATENT DOCUMENTS

| | | |
|---|---|---|
| CN | 102394596 A | 3/2012 |
| CN | 102739198 A | 10/2012 |
| DE | 19924254 A1 | 1/2000 |
| JP | H11340957 A | 12/1999 |
| JP | 2001308686 A | 11/2001 |
| JP | 2011171916 A | 9/2011 |
| JP | 2012156821 A | 8/2012 |

OTHER PUBLICATIONS

Supplementary European Search Report—EP13884165—Search Authority—Munich—dated Nov. 3, 2016, 7 pages.

* cited by examiner

FLIP-FLOP FOR REDUCING DYNAMIC POWER

TECHNICAL FIELD

The present embodiments relate generally to electronic circuits, and specifically to flip-flop circuits.

BACKGROUND OF RELATED ART

Dynamic power consumption is an ongoing concern for integrated circuit (IC) devices, especially with the ever-increasing clock frequencies used in synchronous IC devices. For some IC devices, more than half of the total dynamic power consumption may be attributed to clock distribution networks and flip-flop circuits. Many conventional flip-flops employ inverter circuits to generate complementary clock signals for use by various pass gates and/or tri-state circuits that form the latches and/or gating circuits within the flip-flops. These inverter circuits, as well as the pass gates and tri-state circuits, consume dynamic power every time the clock signal transitions between logic states. As a result, these conventional flip-flops may consume a significant amount of dynamic power even when switching activity is relatively low.

For example, FIG. 1 shows a conventional data flip-flop circuit 100 that includes a first latch 1 10, a second latch 120, a clock inversion circuit 130, and inverters INV0 and INV3. The first latch 1 10 may operate as the "master" latch, and the second latch 120 may operate as the "slave" latch. The first latch 1 10 includes a first pass gate PG1 and a first storage cell 1 1 1 formed by cross-coupled inverters INV1$a$ and INV1$b$. The second latch 120 includes a second pass gate PG2 and a second storage cell 121 formed by cross-coupled inverters INV2$a$ and INV2$b$. The clock inversion circuit 130, which is to generate complementary clock signals for pass gates PG1-PG2 and for tri-state inverters INV1$b$ and INV2$b$ within respective latches 1 10 and 120, includes two series-connected inverters INV4$a$ and INV4$b$. For example, a clock signal CLK is provided to an input of inverter INV4$a$, which inverts (e.g., logically complements) CLK to generate an inverted network clock signal CLKn. The inverted network clock signal CLKn is inverted by inverter INV4$b$ to generate the network clock signal CLKn. Thus, the clock signal CLKn is the logical complement of the clock signal CLKn.

The data signal (D) is inverted by inverter INV0 and provided as a complemented data signal $\overline{D}$ to first pass gate PG1. The first pass gate PG1 includes a control terminal to receive $\overline{CLKn}$, and includes an inverted (e.g., complementary) control terminal to receive CLKn. The inverter INV1$b$ is depicted as a tri-state inverter that includes an enable terminal to receive CLKn and includes an inverted enable terminal to receive $\overline{CLKn}$. The output terminal of first latch 110 is coupled to second pass gate PG2.

The second pass gate PG2 includes a control terminal to receive CLKn, an inverted (e.g., complementary) control terminal to receive CLKn, and an output terminal coupled to the second storage element 121 The inverter INV2$b$ is depicted as a tri-state inverter that includes an enable terminal to receive CLKn and includes an inverted (e.g., complementary) enable terminal to receive CLKn.

When CLK is in a logic low state, inverter INV4$a$ drives CLKn to a logic high state, and inverter INV4$b$ drives CLKn to the logic low state. In response thereto, pass gate PG1 turns on and passes the value of D to first latch 1 10, which stores the value of D. The logic low state of CLKn and the logic high state of CLKn turn off second pass gate PG2, thereby isolating the second latch 120 from the first latch 1 10.

When CLK transitions to logic high, inverter INV4$a$ drives $\overline{CLKn}$ to logic low, and inverter INV4$b$ drives CLKn to logic high. In response thereto, pass gate PG1 turns off and isolates first latch 110 from the input signal D, and second pass gate PG2 turns on and passes the value of $\overline{D}$ from first latch 110 to second latch 120. The second latch 120 stores the value of $\overline{D}$, which is inverted by inverter INV3 and provided as the flip-flop output signal Q so that Q=D.

The inverters INV4$a$-INV4$b$ that generate the complementary clock signals CLKn and $\overline{CLKn}$ consume dynamic power every time the input clock signal CLK transitions between logic states, which is undesirable. In addition, because the pass gates PG1-PG2 and the tri-state inverters INV1$b$ and INV2$b$ are clocked by both CLKn and its complement $\overline{CLKn}$, the pass gates PG1-PG2 and the latches 110 and 120 consume dynamic power every time the clock signal transitions between logic states, which is also undesirable.

Thus, there is a need to reduce the dynamic power consumption associated with flip-flop circuits.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A flip-flop circuit is disclosed that may reduce dynamic power consumption as compared to conventional flip-flop circuits such as the flip-flop circuit 100 of FIG. 1. In accordance with the present embodiments, the flip-flop circuit may include a first latch and a second latch. The first latch, which may operate as a "master" latch, includes a first input terminal to receive a data signal, a second input terminal to receive a clock signal, and an output terminal. The second latch, which may operate as a "slave" latch, includes a first input terminal connected directly to the output terminal of the first latch, a second input terminal to receive the clock signal, and an output terminal to provide an output signal. The first latch and the second latch are to be clocked on the same phase of the clock signal, thereby eliminating the need to include clock inversion circuits that generate complementary clock signals. Eliminating the clock inversion circuits and pass gates may reduce dynamic power consumption (as compared with conventional flip-flop circuits).

For some embodiments, the first latch is to store a complement of the data signal at an internal node when the clock signal is in a logic low state, and is to pass the data signal to the second latch when the clock signal is in a logic high state. Further, for some embodiments, the second latch is to output a previous state of the output signal when the clock signal is in the logic low state, and is to drive the output signal in response to the data signal when the clock signal is in the logic high state.

For some embodiments, the first latch comprises a first OR gate including input terminals to receive the data signal and the clock signal, and including an output terminal; a first NAND gate including a first input terminal to receive the clock signal, a second input terminal, and an output terminal coupled to the first node; and a second NAND gate including a first input terminal coupled to the output terminal of the first OR gate, a second input terminal coupled to the first node, and an output terminal coupled to the second input terminal of the first NAND gate at a second node.

For other embodiments, the flip-flop circuit may include a NOR gate that generates a feedback signal in response to the data signal and the output signal. The feedback signal may be provided to the first latch, which in turn may be configured to ignore the clock signal when the feedback signal is asserted. For at least one of the other embodiments, the first latch comprises a first OR gate including input terminals to receive the data signal and the clock signal, and including an output terminal; a second OR gate including input terminals to receive the feedback signal and the clock signal, and including an output terminal; a first NAND gate including a first input terminal coupled to the output terminal of the second OR gate, a second input terminal, and an output terminal coupled to the first node; and a second NAND gate including a first input terminal coupled to the output terminal of the first OR gate, a second input terminal coupled to the first node, and an output terminal coupled to the second input terminal of the first NAND gate at a second node.

For some embodiments, the second latch comprises a second OR gate including input terminals to receive the clock signal and the output signal, and including an output terminal; and a third NAND gate including a first input terminal coupled to the first node, a second input terminal coupled to the output terminal of the second OR gate, and an output terminal to provide a complement of the output signal.

BRIEF DESCRIPTION OF THE DRAWINGS

The present embodiments are illustrated by way of example and are not intended to be limited by the figures of the accompanying drawings, where.

Like reference numerals refer to corresponding parts throughout the figures.

DETAILED DESCRIPTION

The present embodiments are discussed below in the context of a data type flip-flop circuit for simplicity only. It is to be understood that the present embodiments are equally applicable to other types of flip-flop circuits (e.g., such as set-reset (SR) flip-flops and JK flip-flops). In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

Further, as used herein, the term "inverted" refers to logically inverting a signal to generate its logical complement, and therefore the terms "inverted," "logical complement," and "complemented" may be used interchangeably herein.

Figure 2A:
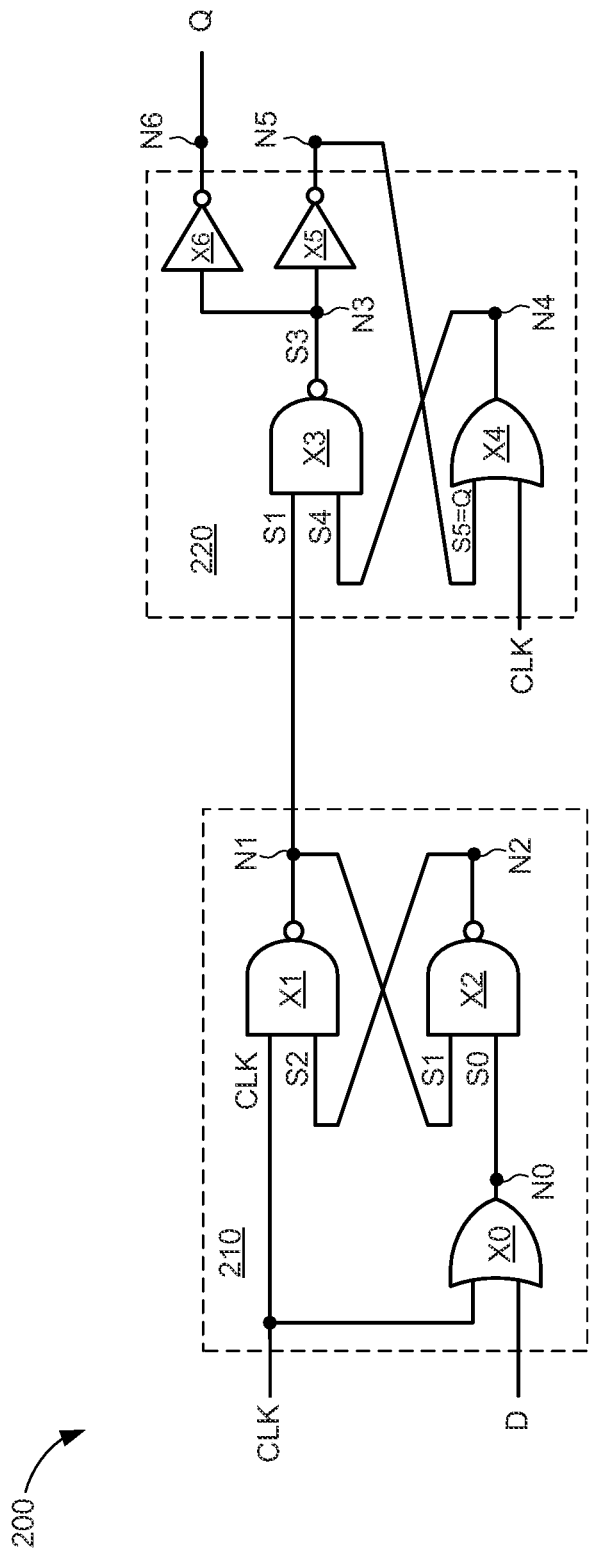
FIG. 2A is a block diagram of a flip-flop circuit in accordance with some embodiments.

FIG. 2A shows a block diagram of a data-type flip-flop circuit 200 in accordance with some embodiments. The flip-flop circuit 200 is shown to include a first latch 210 and a second latch 220. The first latch 210, which may operate as a "master" latch, includes an OR gate X0 and two NAND gates X1 and X2. The OR gate X0 includes input terminals to receive a clock signal CLK and a data bit (D), and includes an output terminal to generate a signal S0. NAND gate X1 includes an output terminal to generate a signal S1 at node N1, and NAND gate X2 includes an output terminal to generate a signal S2 at node N2. NAND gate X1 includes input terminals to receive the clock signal CLK and the signal S2 generated by NAND gate X2, and NAND gate X2 includes input terminals to receive the signal S1 generated by NAND gate X1 and to receive the signal S0 output from OR gate X0. For some embodiments, the signal S1 at first node N1 may be referred to herein as the "internal signal." As described in more detail below, the internal signal S1 may be driven to a logic high state when the first latch 210 latches the data signal D (e.g., in response to a first state of the clock signal CLK), and may be driven to the value of the data signal D when the first latch 210 passes the data signal D to the second latch 220 (e.g., in response to a second state of the clock signal CLK).

The second latch 220, which may operate as a "slave" latch, includes a NAND gate X3, an OR gate X4, and two inverters X5 and X6. NAND gate X3 includes a first input terminal to receive the signal S1 provided by the first latch 210, a second input terminal coupled to an output terminal of OR gate X4, and an output terminal to generate a signal S3 at node N3. Inverter X6 logically inverts the signal S3 to generate the output signal (Q) of flip-flop circuit 200. Inverter X5 logically inverts the signal S3 to generate an internal Q signal. The OR gate X4 includes input terminals to receive the clock signal CLK and the 0 signal generated by inverter X5, and includes an output terminal to generate a signal S4.

Note that the inverters X5 and X6 may operate as inverting buffer circuits. For other embodiments, inverters X5 and X6 may be replaced by other suitable buffer circuits, or may be eliminated. Further, note that the inverters X5 and X6 both generate the output signal Q in response to the signal S3 at node N3. The inverter X5 provides the Q signal back to OR gate X4, while the inverter X6 provides the Q signal as an output signal (e.g., to another circuit or device not shown for simplicity). In this manner, the Q signal provided by inverter X5 may be less susceptible to noise than the Q signal provided by inverter X6, and thus more suitable for use as an internal logic signal by second latch 220. For other embodiments, inverter X5 may be omitted, and the Q signal provided by inverter X6 may be provided to the input terminal of OR gate X4.

An exemplary operation of flip-flop circuit 200 is described below. When the clock signal CLK is in a logic low state (CLK=0), NAND gate X1 forces its output terminal N1 to logic high so that signal S1=1, and OR gate X0 passes the value of D as its output signal S0 so that S0=D. The logic high state of signal S1 causes NAND gate X2 to invert the data bit D and pass its logical complement $\overline{D}$ to node N2, thereby driving signal S2=$\overline{D}$. Thus, when the clock signal CLK is logic low, the first latch 210 stores the value of $\overline{D}$ at node N2. For example, if D=0, then the first latch 210 stores a value of $\overline{D}$=1 at node N2; conversely, if D=1, then the first latch 210 stores a value of $\overline{D}$=0 at node N2.

The logic high state of signal S1 and the logic low value of CLK are provided to the second latch 220. In response to CLK=0, OR gate X4 passes the previous value of Q as signal S4 to NAND gate X3. In response to the logic high state of signal S1, NAND gate X3 inverts signal S4 and drives its output signal S3 to the value of $\overline{Q}$. Inverter X6 inverts the value of signal S3 to drive its output signal S6 to the value of Q (S6=Q), thereby maintaining the previous state of the output signal Q. Inverter X5 also inverts the value of signal S3 to drive its output signal S5 to the value of Q (S5=Q), thereby maintaining the input signal S5 to OR gate X4 equal to the value of the output signal Q. In this manner, the previous value of the complemented output signal $\overline{Q}$ is stored at node N3 by the NAND-INV-OR structure formed within the second latch 220.

When the clock signal CLK transitions to the logic high state (CLK=1), the first latch 210 passes the previously latched value of D to the second latch 220 via node N1. More specifically, in response to CLK=1, NAND gate X1 inverts the input signal $\overline{D}$ stored at node N2 to generate the data signal D at node N1; the value of D is then provided as signal S1 to the second latch 220. The logic high state of CLK also forces the OR gate X0 to drive its output signal S0 to logic high. The logic high state of signal S0 causes NAND gate X2 to pass an inverted value of signal S1 to its output terminal N2, thereby maintaining node N2 at the value of $\overline{D}$. In this manner, the first latch 210 stores the value of $\overline{D}$ at node N2 and stores the value of D at node N1. Note that the first latch 210 formed by NAND gates X1 and X2 may continue storing the value of D at node N1 and the value of $\overline{D}$ at node N2 until the clock signal CLK transitions from logic high to logic low.

The value of D at node N1 is provided as signal S1 to NAND gate X3. The logic high state of CLK causes OR gate X4 to force its output signal S4 to logic high, which in turn causes NAND gate X3 to invert the value of D. Therefore, NAND gate X3 drives node N3 to the value of $\overline{D}$ such that signal S3=$\overline{D}$. Inverter X6 inverts the value of signal S3, and therefore drives the output signal Q to the value of D such that Q=D. Inverter X5 also inverts the value of signal S3 to drive its output signal S5 to the value of D such that S5=D=Q, thereby maintaining the input signal S5 to OR gate X4 equal to the value of the output signal Q. In this manner, the output signal Q is updated with the current value of the input data bit D by the NAND-INV-OR structure formed within the second latch 220.

As described above, the flip-flop circuit 200 may operate as a data-type flip-flop in which the first latch 210 acts as master latch and the second latch 220 acts as a slave latch. More specifically, when the clock signal CLK transitions from logic high to logic low, the first latch 210 stores the current value of the input data bit D and the second latch 220 stores the previous value of the output signal Q. When the clock signal CLK transitions from logic low to logic high, the first latch 210 passes the current value of the input data bit D to the second latch 220 (while ignoring any changes in the value of D), and the second latch 220 provides the current value of D as the output signal Q.

Figure 1:
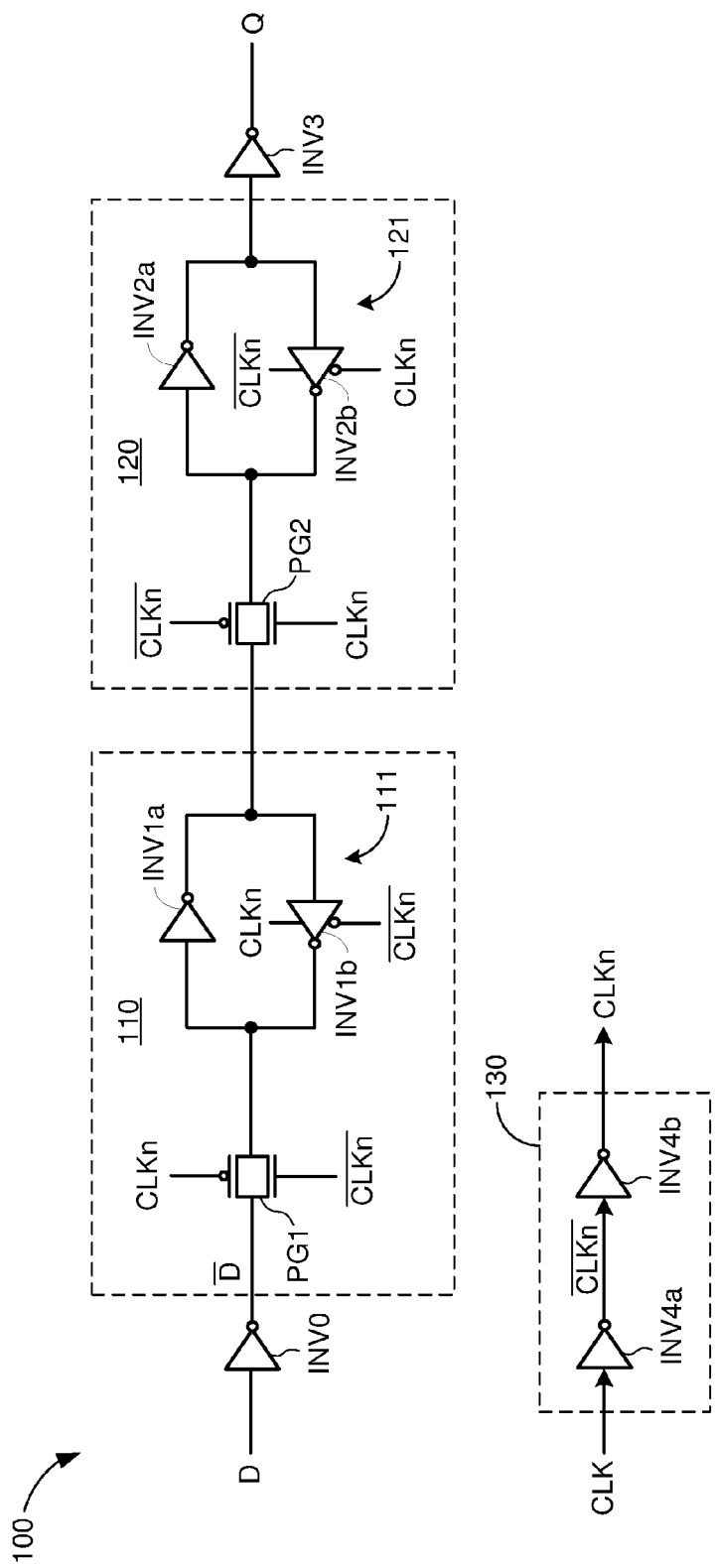
FIG. 1 is a circuit diagram of a conventional flip-flop circuit.

In accordance with the present embodiments, the first latch 210 and the second latch 220 of the flip-flop circuit 200 may operate on the same phase of the clock signal CLK, thereby eliminating the need to generate complementary clock signals. As a result, the flip-flop circuit 200 does not need clock inversion circuits (such as, for example, the clock inversion circuit 130 of FIG. 1) to generate complementary clock signals. The ability to eliminate clock inversion circuits may reduce the dynamic power consumption associated with generating complementary clock signals (as compared to the conventional flip-flop circuit 100 of FIG. 1). For example, while the inverters INV4a-INV4b of FIG. 1 may consume dynamic power upon every state transition of the clock signal CLK, state transitions of the clock signal CLK may not result in similar dynamic power consumption of flip-flop circuit 200 because there is no clock inversion circuit in the flip-flop circuit 200 of FIG. 2A. Further, in contrast to the conventional flip-flop circuit 100 of FIG. 1, the flip-flop circuit 200 of FIG. 2A does not include pass gates and tri-state inverters within the latches 110 and 120, thereby eliminating the dynamic power consumption associated with sequentially switching tri-state inverters and pass gates in response to state transitions of the clock signal CLK. As a result, the flip-flop circuit 200 of FIG. 2A may consume less dynamic power than the conventional flip-flop circuit 100 of FIG. 1.

Figure 2B:
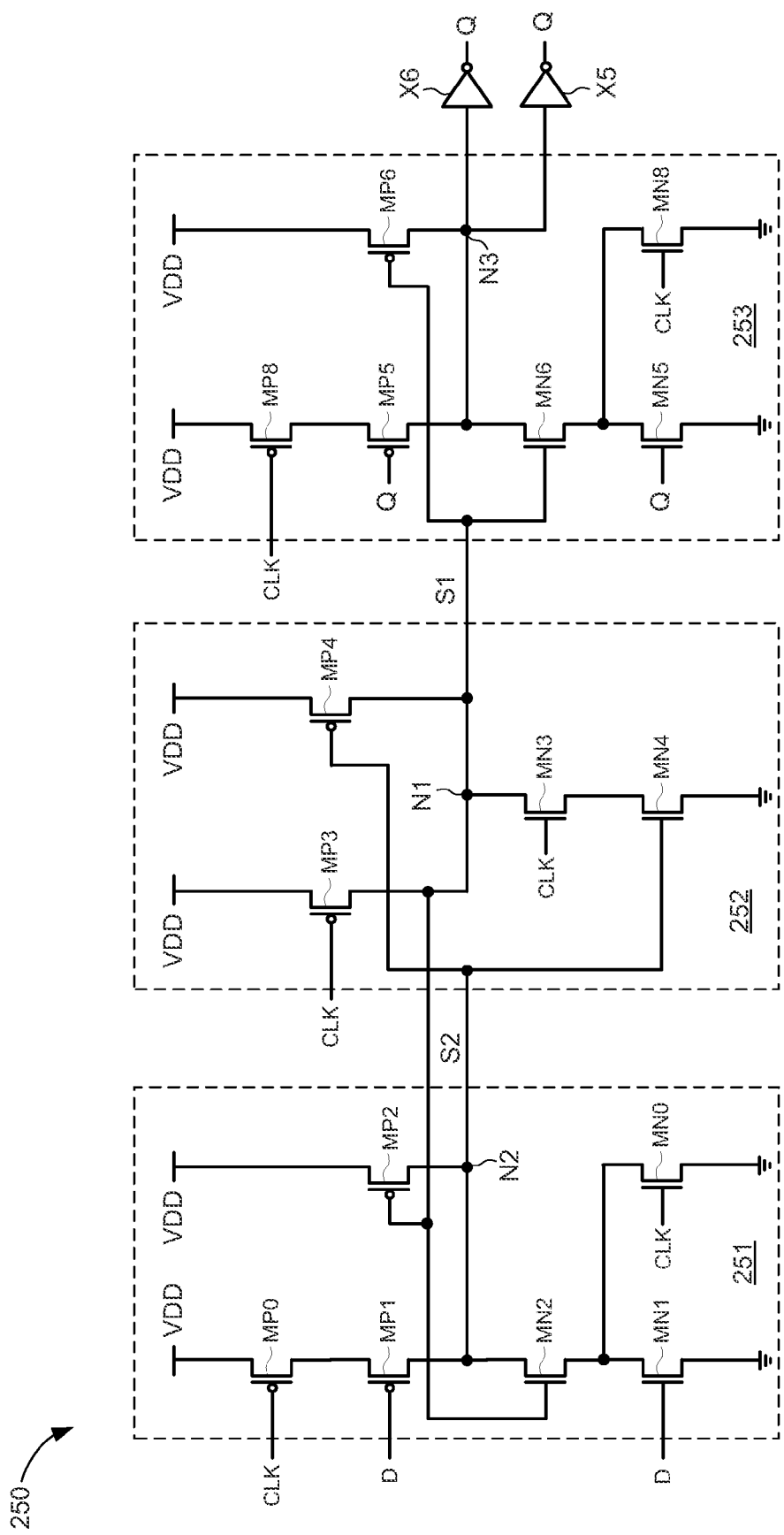
FIG. 2B is a circuit diagram of one embodiment of the flip-flop circuit of FIG. 2A.

FIG. 2B shows a flip-flop circuit 250 that is one embodiment of the flip-flop circuit 200 of FIG. 2A. Flip-flop circuit 250 is shown to include a first logic gate 251, a second logic gate 252, and a third logic gate 253. For some embodiments, the first logic gate 251 may operate as an OR-AND-INVERT (OAI) gate, the second logic gate 252 may operate as a NAND gate, and the third logic gate 253 may operate as an OAI gate. Further, for at least one embodiment, the first and second logic gates 251-252 of FIG. 2B may implement the first latch 210 of FIG. 2A, and the third logic gate 253 combined with gates X5 and X6 of FIG. 2B may implement the second latch 220 of FIG. 2A. More specifically, the first logic gate 251 may implement the OR gate X0 and NAND gate X2 of FIG. 2A, and the second logic gate 252 may implement the NAND gate X1 of FIG. 2A.

The first logic gate 251 includes NMOS transistors MN0-MN2 and PMOS transistors MP0-MP2. Transistors MN1 and MN2 are coupled in series between node N2 and ground potential, and transistor MN0 is coupled in parallel with transistor MN1. Transistor MN1 has a gate to receive the input data bit D, transistor MN0 has a gate to receive the clock signal CLK, and transistor MN2 has a gate coupled to node N1. Transistors MP0 and MP1 are coupled in series between node N2 and a voltage supply VDD, and transistor MP2 is coupled between node N2 and VDD. Transistor MP1 has a gate to receive the input data bit D, transistor MP0 has a gate to receive the clock signal CLK, and transistor MP2 has a gate coupled to node N1.

The second logic gate 252 includes NMOS transistors MN3-MN4 and PMOS transistors MP3-MP4. Transistors MN3 and MN4 are coupled in series between node N1 and ground potential. Transistor MN3 has a gate to receive the clock signal CLK, and transistor MN4 has a gate coupled to node N2. Transistors MP3 and MP4 are coupled in parallel between node N1 and VDD. Transistor MP3 has a gate to receive the clock signal CLK, and transistor MP4 has a gate coupled to node N2.

The third logic gate 253 includes NMOS transistors MN5, MN6, and MN8, and includes PMOS transistors MP5, MP6, and MP8. Transistors MN5 and MN6 are coupled in series between node N3 and ground potential, and transistor MN8 is coupled in parallel with transistor MN5. Transistor MN5 has a gate to receive the output signal Q, transistor MN6 has a gate coupled to node N1, and transistor MN8 has a gate to receive the clock signal CLK. Transistors MP5 and MP8 are coupled in series between node N3 and VDD, and transistor MP6 is coupled between node N3 and VDD. Transistor MP5 has a gate to receive the output signal Q, transistor MP8 has a gate to receive the clock signal CLK, and transistor MP6 has a gate coupled to node N1.

An exemplary operation of flip-flop circuit 250 is described below. When the clock signal CLK is in the logic low state (CLK=0), the first logic gate 251 latches the value of the input data bit D by storing its complement signal $\overline{D}$ at node N2, and the third logic gate 253 maintains the previous value of the output signal Q. More specifically, in response to CLK=0, transistors MP0, MP3, and MP8 turn on, and transistors MN0, MN3, and MN8 turn off. The conductive transistor MP3 pulls node N1 high towards VDD so that signal S1 is in the logic high state, which causes transistor MN2 to turn on and causes transistor MP2 to turn off. The value of D is inverted by the inverter formed by transistors MP1 and MN1, thereby driving node N2 to the complemented value of $\overline{D}$. Thus, when the clock signal CLK is logic low, the "master" latch formed by logic gates 251-252 stores the value of $\overline{D}$ at node N2.

The logic high state of signal S1 and the logic low state of CLK are provided to the third logic gate 253. In response to CLK=0, transistor MP8 turns on and transistor MN8 turns off. The logic high state of signal S1 at node N1 turns transistor MN6 on, and turns transistor MP6 off. The previous value of the output signal Q is inverted by the inverter formed by transistors MP5 and MN5, thereby driving node N3 to the complemented value $\overline{Q}$. Inverters X5 and X6 invert the value of signal S3 at node N3 to maintain the previous value of the output signal Q.

When the clock signal CLK transitions to logic high (CLK=1), the second logic gate 252 passes the value of D, as latched by the first logic gate 251, to the third logic gate 253. The third logic gate 253 may then update the value of the output signal Q in response to the latched value of D. More specifically, in response to CLK=1, transistors MP0, MP3, and MP8 turn off, and transistors MN0, MN3, and MN8 turn on. The conductive transistor MN0 connects the drain of transistor MN2 to ground potential, the conductive transistor MN3 connects the source of transistor MN4 to node N1, and the conductive transistor MN8 connects the drain of transistor MN6 to ground potential. The non-conductive transistor MP0 prevents transistor MP1 from pulling node N2 high towards VDD in response to D, thereby ensuring that node N2 continues to latch the previous value of $\overline{D}$ regardless of the current value of D provided to the first logic gate 251 when CLK=1.

The latched value of $\overline{D}$ at node N2 is logically inverted by the inverter formed by transistors MP4 and MN4 to generate the value of D at node N1. The value of D at node N1 is logically inverted by the inverter formed by transistors MP2 and MN2 to drive its output signal at node N2 to $\overline{D}$, thereby operating as a "keeper" circuit to maintain the value of $\overline{D}$ at node N2.

The value of D at node N1 is also logically inverted by the inverter formed by transistors MP6 and MN6 to drive its output signal at node N3 to $\overline{D}$, which is inverted by inverters X5 and X6 to drive the output signal Q to the value of D (e.g., Q=D). In this manner, the logic high state of CLK transfers the value of D from the second logic gate 252 to the third logic gate 253 while allowing the first logic gate 251 to ignore state transitions in the input data bit D until the clock signal CLK transitions from logic high to logic low.

Referring again to FIG. 2A, the flip-flop circuit 200 may consume unnecessary dynamic power when the next state of D and the current state of Q are both logic low. For example, the logic low state of CLK causes NAND gate X1 to drive node N1 to logic high. At the same time, node N0 is driven to logic low when the input data bit D=0, and therefore node N2 is also pulled up to logic high. Then, when CLK transitions from logic low to logic high, NAND gate X1 drives node N1 from logic high to logic low. However, the output signal Q doesn't change its state and is maintained at logic low. As a result, the node N1 may transition unnecessarily between logic states 0 and 1 when the next value of D and the current value of Q are both 0.

Figure 3A:
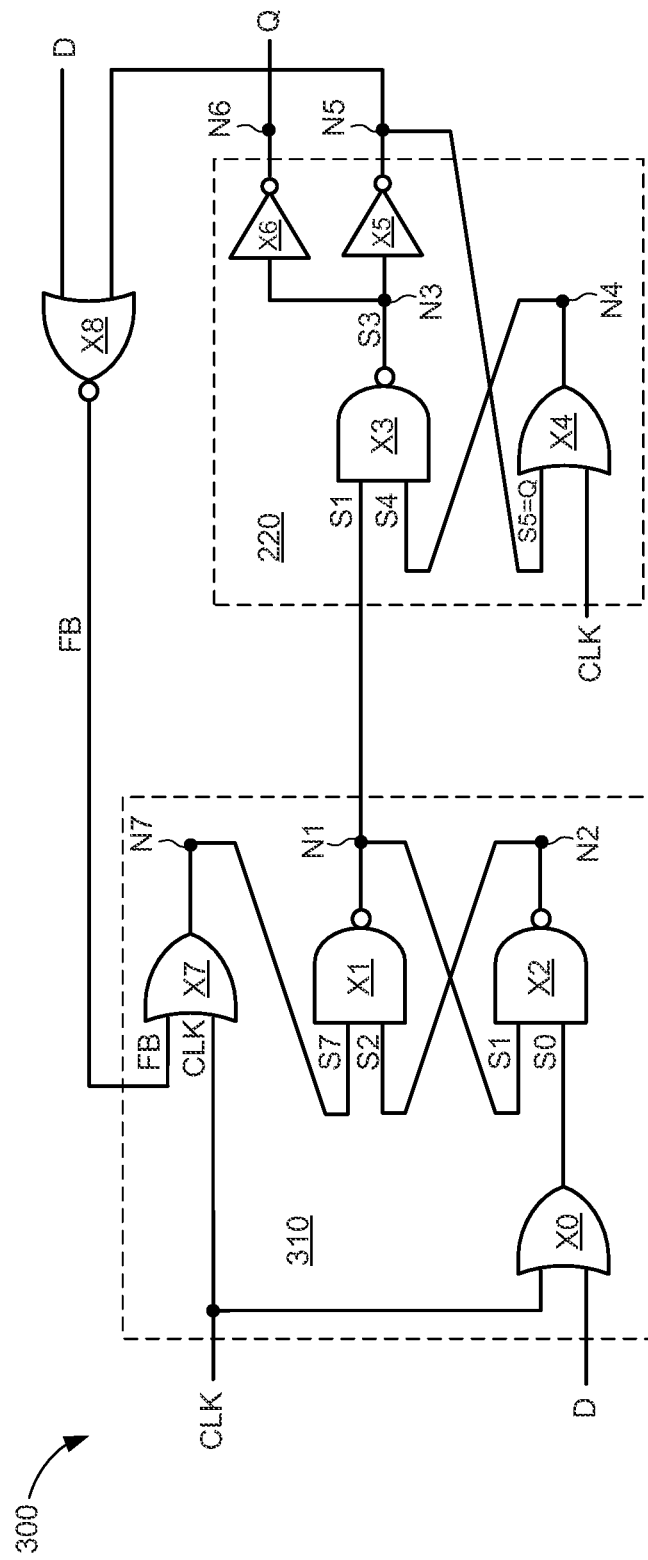
FIG. 3A is a block diagram of a flip-flop circuit in accordance with other embodiments.

To avoid this potential timing problem, a feedback signal may be provided, for example, as shown in FIG. 3A. FIG. 3A shows a block diagram of a data-type flip-flop circuit 300 in accordance with other embodiments. The flip-flop circuit 300 includes a first latch 310, the second latch 220 of FIG. 2A, and a NOR gate X8 that provides a feedback signal FB to the first latch 310. The first latch 310 includes all the elements of first latch 210 of FIG. 2A, plus an OR gate X7. The clock signal CLK is provided to a first input terminal of OR gate X7, the feedback signal FB is provided to a second input terminal of OR gate X7, and the output terminal of OR gate X7 is coupled to the first input terminal of NAND gate X1. The NOR gate X8 includes a first input terminal to receive the input data bit D, a second input terminal to receive the output signal Q, and an output terminal to provide the feedback signal FB.

The feedback signal FB may eliminate the unnecessary power consumption problem discussed above when the current value of the output signal Q and the incoming value of the data bit D are both logic low (i.e., when Q=D=0). For example, when Q=D=0, the NOR gate X8 drives the feedback signal FB to logic high (FB=1), which forces OR gate X7 to drive its output signal S7 at node N7 to logic high, irrespective of the clock signal CLK. For this case, the logic high state of signal S7, generated in response to D=0 and Q=0, ensures that NAND gate X1 inverts the value of $\overline{D}$=1 at node N2 and then drives node N1 to logic low (to pass D=0 to second latch 220).

For all other cases of D and Q, the NOR gate X8 drives the feedback signal FB to logic low (FB=0), thereby allowing OR gate X7 to pass the value of CLK to the NAND gate X1. For these other cases, the first latch 310 may operate in a similar manner as the first latch 210 of FIG. 2A.

Figure 3B:
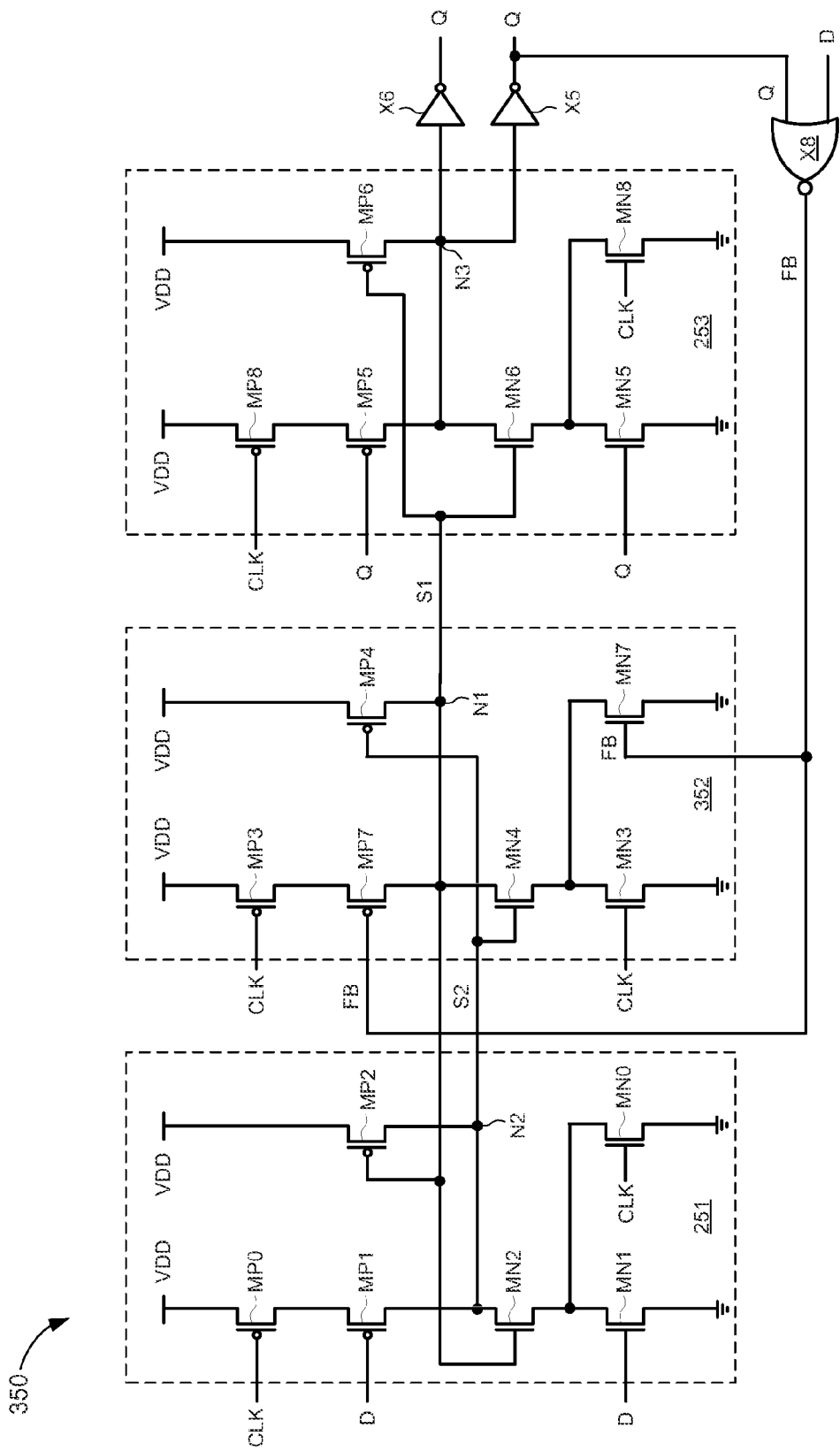
FIG. 3B is a circuit diagram of one embodiment of the flip-flop circuit of FIG. 3A.

FIG. 3B shows a flip-flop circuit 350 that is one embodiment of the flip-flop circuit 300 of FIG. 3A. Flip-flop circuit 350 is shown to include the first logic gate 251 of FIG. 2B, a second logic gate 352, and the third logic gate 253 of FIG. 2B. For some embodiments, the first logic gate 251, the second logic gate 352, and the third logic gate 253 may each operate as OAI circuit. Further, for at least one embodiment, the first and second logic gates 251 and 352 of FIG. 3B may implement the first latch 310 of FIG. 3A, and the third logic gate 253 combined with gates X5 and X6 of FIG. 3B may implement the second latch 220 of FIG. 3A.

The second logic gate 352 includes NMOS transistors MN3, MN4, and MN7, and includes PMOS transistors MP3, MP4, and MP7. Transistors MN3 and MN4 are coupled in series between node N1 and ground potential. Transistor MN3 has a gate to receive the clock signal CLK, and transistor MN4 has a gate coupled to node N2. Transistor MN7 is coupled in parallel with transistor MN3, and has a gate to receive the feedback signal FB. Transistors MP3 and MP7 are coupled in series between node N1 and VDD. Transistor MP3 has a gate to receive the clock signal CLK, and transistor MP7 has a gate to receive the feedback signal FB. Transistor MP4 is coupled between node N1 and VDD, and has a gate coupled to node N2. Note that transistors MP7 and MN7 of FIG. 3B may implement the OR gate X7 of FIG. 3A.

An exemplary operation of the flip-flop circuit 350 of FIG. 3B is discussed below with respect to different combinations of the values of the input data bit D and the output signal Q. The first case is when the next state of D is logic low and the current state of Q is logic high (i.e., when D=0 and Q=1). When the clock signal CLK=0, the inverter formed by transistors MP5 and MN5 inverts the logic high value of Q to drive node N3 to logic low, which in turn is inverted by inverter X6 to maintain Q=1. In response to D=0 and Q=1, NOR gate X8 drives the feedback signal FB to logic low, which turns on transistor MP7 and turns off transistor MN7. As a result, node N1 is pulled high towards VDD by transistor MP3 in response to CLK=0, which turns on transistor MN2. Thus, the inverter formed by transistors MP1 and MN1 may drive node N2 to the state D=1. In this manner, the third logic gate 253 maintains the current value of Q=1, and the first logic gate 251 latches the value of D=0.

When CLK transitions from logic low to logic high, transistor MN3 turns on and pulls node N1 low towards ground potential. The logic low state of node N1 turns on transistor MP2, which pulls node N2 high towards VDD and therefore maintains the logic high state of node N2 to continue latching $\overline{D}$=1 at node N2. The logic low state of node N1 turns off transistor MN6 and turns on transistor MP6, thereby pulling node N3 high towards VDD and latching $\overline{Q}$=1 at node N3. In response thereto, inverter X6 updates Q=0 in response to D=0. Note that while CLK=1, node N2 is maintained in the logic high state by the conductive transistor MP2, and node N1 is maintained in the logic low state by the conductive transistors MN3 and MN4. Transistors MP0, MP3, MP4 and MN5 are non-conductive, thereby maintaining the latched value of D=0 in logic gates 251 and 352, irrespective of subsequent state changes in the data bit D.

When CLK transitions from logic high to logic low, the previous value of Q is latched in the third logic gate 253, and the first and second logic gates 251 and 352 are ready to latch the next value of D.

The second case is when the next state of D is logic high and the current state of Q is logic low (i.e., when D=1 and Q=0). When the clock signal CLK=0, the inverter formed by transistors MP5 and MN5 inverts the logic low value of Q to drive node N3 to logic high, which in turn is inverted by inverter X6 to maintain Q=0. In response to D=1 and Q=0, NOR gate X8 drives the feedback signal FB to logic low, which turns on transistor MP7 and turns off transistor MN7. As a result, node N1 is pulled high towards VDD by transistor MP3 in response to CLK=0, which turns on transistor MN2. Thus, the inverter formed by transistors MP1 and MN1 may drive node N2 to the state $\overline{D}$=0. In this manner, the third logic gate 253 maintains the current value of Q=0, and the first logic gate 251 latches the value of D=1.

When CLK transitions from logic low to logic high, transistor MN3 turns on, but transistor MN4 remains off and isolates node N1 from ground potential. The logic high state of node N1 turns on transistor MN2, which pulls node N2 low towards ground potential and therefore maintains the logic low state of node N2 to continue latching $\overline{D}$=0 at node N2. The logic high state of node N1 turns on transistor MN6 and turns off transistor MP6, thereby pulling node N3 low towards ground potential and latching $\overline{Q}$=0 at node N3. In response thereto, inverter X6 updates Q=1 in response to D=1. Note that while CLK=1, node N2 is maintained in the logic low state by the conductive transistor MN2 (which may act as a "keeper" circuit), and node N1 is maintained in the logic high state by the conductive transistor MP4. Transistors MP0, MP2, and MN4 are non-conductive, thereby maintaining the latched value of D=1 in logic gates 251 and 352, irrespective of subsequent state changes in the data bit D. When CLK transitions from logic high to logic low, the previous value of Q is latched in the third logic gate 253, and the first and second logic gates 251 and 352 are ready to latch the next value of D.

The third case is when the next state of D is logic low and the current state of Q is logic low (i.e., when D=0 and Q=0). When the clock signal CLK=0, the inverter formed by transistors MP5 and MN5 inverts the logic low value of Q to drive node N3 to logic high, which in turn is inverted by inverter X6 to maintain Q=0. In response to D=0 and Q=0, NOR gate X8 drives the feedback signal FB to logic high, which turns off transistor MP7 and turns on transistor MN7. As a result, node N1 is maintained in the logic low state and node N2 is maintained in the logic high state, irrespective of the clock signal CLK and transition in the value of D. In this manner, node N2 remains in the logic high state and latches the value $\overline{D}$=1 without using the inverter formed by transistors MP1 and MN1. In this manner, the dynamic power consumption may be reduced because transistors MP1 and MN1 do not charge or discharge node N2.

The fourth case is when the next state of D is logic high and the current state of Q is logic high (i.e., when D=1 and Q=1). When the clock signal CLK=0, the inverter formed by transistors MP5 and MN5 inverts the logic high value of Q to drive node N3 to logic low, which in turn is inverted by inverter X6 to maintain Q=1. In response to D=1 and Q=1, NOR gate X8 drives the feedback signal FB to logic low, which turns on transistor MP7 and turns off transistor MN7. As a result, node N1 is maintained in the logic high state by transistors MP3 and MP7, and node N2 is discharged low towards ground potential by transistors MN1 and MN2. Thereafter, node N1 is maintained in the logic high state, and node N2 is maintained in the logic low state, irrespective of the clock signal CLK and transitions in the value of D. In this manner, dynamic power consumption may be reduced.

Additionally, the flip-flop circuit 200 may be subject to errors resulting from timing mismatches. For example, if the NAND gate X1 is weaker than OR gate X0 and the NAND gate X2, then a first time delay associated with NAND gate X1 transitioning the state of node N1 in response to transitions in the clock signal CLK may be longer than a second time delay associated with OR gate X0 and NAND gate X2 transitioning the state of node N2 in response to transitions in the clock signal CLK, which in turn may result in the first latch 210 latching an incorrect value of the input data bit D. For example, a logic low state of CLK causes NAND gate X1 to drive node N1 to logic high. If the current value of the data bit D is logic low (D=0), then NAND gate X2 drives node N2 to logic high so that signal S2=D̄. Then, when CLK transitions from logic low to logic high, OR gate X0 drives node N0 to logic high. However, if the first time delay is greater than the second time delay, then NAND gate X2 may drive node N2 to logic low before NAND gate X1 drives node N1 to logic low to capture the value of D=0. If this happens, then NAND gate X1 may undesirably maintain node N1 in a logic high state, thereby failing to correctly latch the value D=0. Note that this problem may not exist when the current value of D=1 because maintaining node N1 in the logic high state may reflect the correct value of D̄.

Figure 3C:
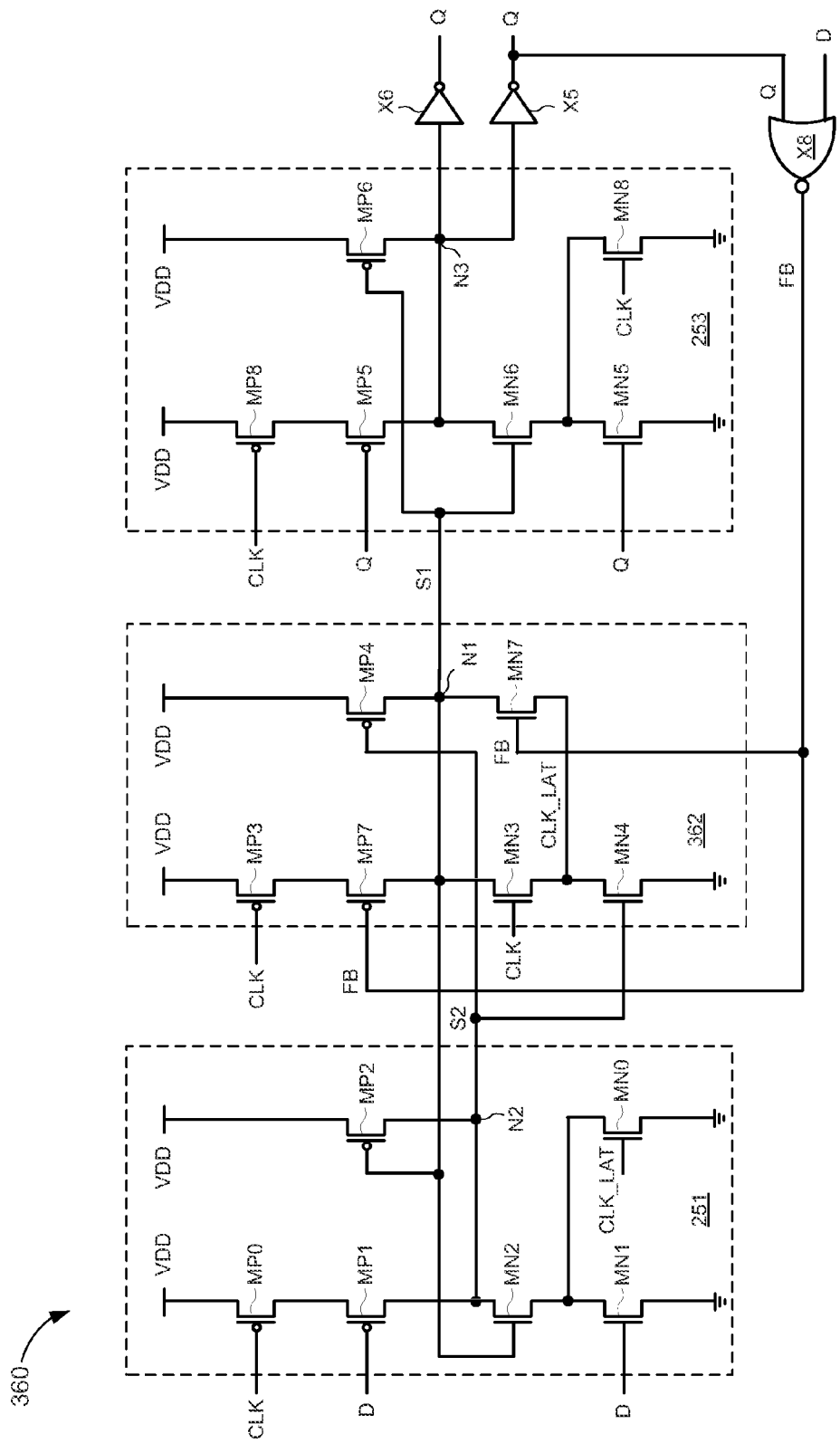
FIG. 3C is a circuit diagram of another embodiment of the flip-flop circuit of FIG. 3A.

To avoid this potential timing problem, a secondary clock signal may be generated, as shown in FIG. 3C. Flip-flop circuit 360 is shown to include the first logic gate 251 of FIG. 2B, a second logic gate 362, and the third logic gate 253 of FIG. 2B. For some embodiments, the first logic gate 251, the second logic gate 362, and the third logic gate 253 may each operate as OAI circuit. Further, for at least one embodiment, the first and second logic gates 251 and 362 of FIG. 3C may implement the first latch 310 of FIG. 3A, and the third logic gate 253 combined with gates X5 and X6 of FIG. 3C may implement the second latch 220 of FIG. 3A.

The second logic gate 362 of FIG. 3C is similar to the second logic gate 352 of FIG. 3B, except that for the embodiment of FIG. 3O, transistors MN3 and MN7 are coupled between node N1 and the drain of transistor MN4. Thus, while the transistors MN3 and MN7 are coupled in parallel between ground potential and the source of transistor MN4 in the flip-flop circuit 350 of FIG. 3B, the transistors MN3 and MN7 are coupled in parallel between node N1 and the drain of MN4 in the flip-flop circuit 360 of FIG. 3C. For the flip-flop circuit 360 of FIG. 3C, when the next state of D is logic low and the current state of Q is logic high, the feedback signal FB is asserted to logic low, and transistor MN7 turns off and transistor MP7 turns on. As a result, node N1 is charged to VDD by transistor MP3 in response to CLK=0, which turns on transistor MN2. Then, the inverter formed by transistors MP1 and MN1 may drive node N2 to the state D=1. Thereafter, transistor MN4 is turned on to pull down the signal CLK LAT to logic low. When CLK transitions from logic low to logic high, node N1 is discharged towards ground potential and CLK_LAT maintains at logic low, which suppresses the potential timing race effectively.

The other advantage of this improvement of the flip-flop 360 of FIG. 3C is power saving. For example, both of the next state of D and the current state of Q are logic high, the feedback signal FB is asserted to logic low, and transistor MN7 turns off and MP7 turns on. As a result, node N1 is charged to VDD by transistor MP3 in response to CLK=0, which turns on transistor MN2. As a result, the inverter formed by transistors MP1 and MN1 may drive node N2 to the state D̄=0. Thus, transistor MP4 is turned on to maintain node N1 at logic high, and transistor MN4 is turned off to isolate CLK_LAT from ground potential. When CLK transitions from logic low to logic high, transistor MN3 is turned on and CLK_LAT is charged to VDD-VT through the conductive transistor MN3. Thereafter, the CLK_LAT is provided to the gate of transistor MN0 in the first logic gate 251 (e.g., rather than the clock signal CLK), which may also reduce dynamic power consumption.

Note that the conductive transistor MN3 charges the drain of transistor MN4 to approximately one transistor threshold voltage below VDD (e.g., to VDD-VT), which may reduce power consumption (as compared with charging the drain of transistor MN4 to approximately VDD).

Figure 3D:
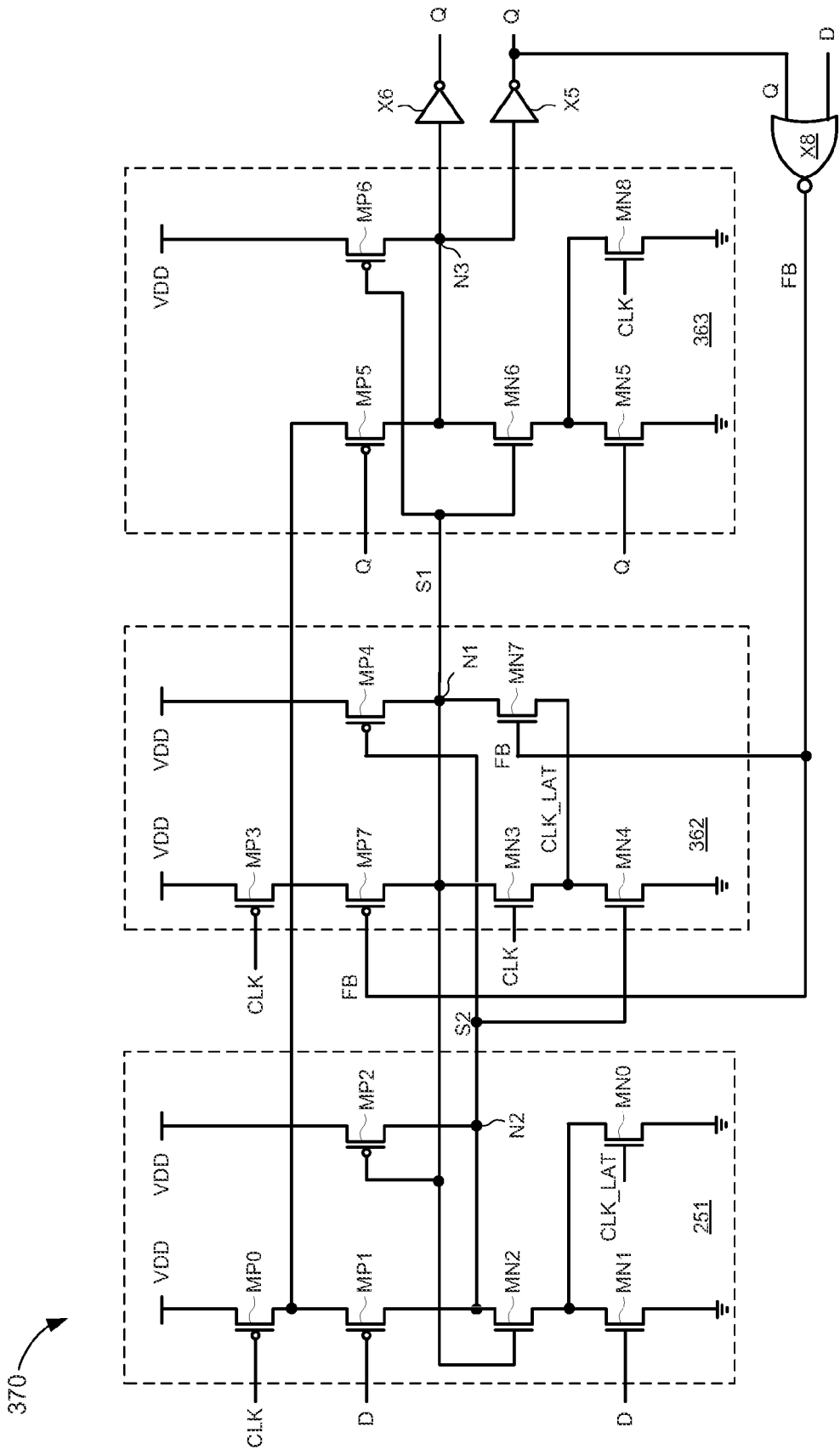
FIG. 3D is a circuit diagram of yet another embodiment of the flip-flop circuit of FIG. 3A.

FIG. 3D shows a flip-flop circuit 370 that is another embodiment of the flip-flop circuit 300 of FIG. 3A. Flip-flop circuit 370 is shown to include the first logic gate 251 of FIG. 2B, the second logic gate 362 of FIG. 3C, and a third logic gate 363. For some embodiments, the first logic gate 251, the second logic gate 362, and the third logic gate 363 may each operate as OAI circuit. Further, for at least one embodiment, the first and second logic gates 251 and 362 of FIG. 3D may implement the first latch 310 of FIG. 3A, and the third logic gate 363 combined with gates X5 and X6 of FIG. 3D may implement the second latch 220 of FIG. 3A.

The third logic gate 363 of FIG. 3D is similar to the third logic gate 353 of FIG. 2B, except that for the embodiment of FIG. 3D, transistor MP8 is eliminated, and the source of transistor MP5 is coupled to the drain of transistor MP0. In this manner, transistor MP0 may perform the same functions as the omitted transistor MP8, thereby reducing circuit area.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A flip-flop circuit, comprising:
    a first latch including:
        a first input terminal to receive a data signal, a second input terminal to receive a clock signal, and an output terminal at a first node;
    a second latch including:
        a first input terminal connected directly to the output terminal of the first latch, a second input terminal to receive the clock signal, and an output terminal to provide an output signal, wherein the first latch and the second latch are to be clocked on a same phase of the clock signal; and
    a feedback path to receive the output signal from the second latch and provide a feedback signal to the first latch.

2. The flip-flop circuit of claim 1, wherein the first latch is to operate as a master latch, and the second latch is to operate as a slave latch.

3. The flip-flop circuit of claim 1, wherein each node in the first latch and the second latch operate in a logic high state or a logic low state during operation of the flip-flop circuit.

4. The flip-flop circuit of claim 1, wherein the first latch comprises:
    a first OR gate including input terminals to receive the data signal and the clock signal, and including an output terminal;
    a second OR gate including input terminals to receive the feedback signal and the clock signal, and including an output terminal;
    a first NAND gate including a first input terminal coupled to the output terminal of the second OR gate, a second input terminal, and an output terminal coupled to the first node; and
    a second NAND gate including a first input terminal coupled to the output terminal of the first OR gate, a second input terminal coupled to the first node, and an output terminal coupled to the second input terminal of the first NAND gate at a second node.

5. The flip-flop circuit of claim 4, wherein:
the first latch is to store a complement of the data signal at the second node when the clock signal and the feedback signal are in a logic low state; and
the first latch is to pass the data signal to the second latch via the first node when the clock signal is in a logic high state.

6. The flip-flop circuit of claim 4, wherein the second latch comprises:
a third OR gate including input terminals to receive the clock signal and the output signal, and including an output terminal; and
a third NAND gate including a first input terminal coupled to the first node, a second input terminal coupled to the output terminal of the third OR gate, and an output terminal to provide a complement of the output signal.

7. The flip-flop circuit of claim 6, wherein:
the second latch is to output a previous state of the output signal when the clock signal is in a logic low state; and
the second latch is to drive the output signal in response to the data signal when the clock signal is in a logic high state.

8. The flip-flop circuit of claim 1, wherein:
the first latch comprises a first OR-AND-INVERT logic gate connected to a second OR-AND-INVERT logic gate; and
the second latch comprises a third OR-AND-INVERT logic gate.

9. The flip-flop circuit of claim 1, wherein the feedback path comprises:
a NOR gate including input terminals to receive the data signal and the output signal, and including an output terminal to provide the feedback signal to the first latch.

10. The flip-flop circuit of claim 9, wherein:
the NOR gate is to drive the feedback signal to an asserted state when the data signal and the output signal are both in logic low states; and
the first latch is to ignore the clock signal when the feedback signal is in the asserted state.

11. A flip-flop circuit to selectively drive an output signal in response to a data signal, flip-flop circuit comprising:
a first latch, comprising:
a first logic gate including: input terminals to receive the data signal and a clock signal, and an output terminal to latch a complement of the data signal when the clock signal is in a first state;
a second logic gate including: input terminals to receive the clock signal and a feedback signal, and an output terminal to generate a first internal signal;
a third logic gate including: input terminals to receive the first internal signal and the complement of the data signal, and an output terminal to generate a second internal signal;
a second latch, connected directly to the first latch, comprising:
a fourth logic gate including input terminals to receive the clock signal, the output signal, and the second internal signal, and an output terminal to provide the output signal; and
a feedback path to receive the output signal and provide the feedback signal to the second logic gate.

12. The flip-flop circuit of claim 11, wherein the first, second, third, and fourth logic gates are to operate on a same phase of the clock signal when the feedback signal is in the first state.

13. The flip-flop circuit of claim 11, wherein each node in the first latch and the second latch operate in a logic high state or a logic low state.

14. The flip-flop circuit of claim 11, wherein the third logic gate is to:
drive the second internal signal to a logic high state when the clock signal and the feedback signal are in the first state; and
drive the internal signal to a state indicative of the data signal when the clock signal is in a second state.

15. The flip-flop circuit of claim 11, wherein:
the third logic gate is to maintain a previous state of the output signal when the clock signal is in the first state; and
the third logic gate is to drive the output signal to the state of the second internal signal when the clock signal is in the second state.

16. The flip-flop circuit of claim 11, wherein:
the first logic gate comprises a first OR-AND-INVERT logic gate;
the third logic gate comprises a NAND gate; and
the fourth logic gate comprises a second OR-AND-INVERT logic gate.

17. The flip-flop circuit of claim 11, wherein the first, third, and fourth logic gates each comprise an OR-AND-INVERT logic gate.

18. The flip-flop circuit of claim 11, wherein for the first latch:
the first logic gate comprises a first OR gate;
the second logic gate comprises a second OR gate; and
the third logic gate comprises:
a first NAND gate including a first input terminal to receive the first internal signal, a second input terminal, and an output terminal to provide the second internal signal; and
a second NAND gate including a first input terminal coupled to the output terminal of the first OR gate, a second input terminal to receive the second internal signal, and an output terminal coupled to the second input terminal of the first NAND gate.

19. The flip-flop circuit of claim 18, wherein the fourth logic gate comprises:
a third OR gate including input terminals to receive the clock signal and the output signal, and including an output terminal; and
a third NAND gate including a first input terminal to receive the second internal signal, a second input terminal coupled to the output terminal of the third OR gate, and an output terminal to provide a complement of the output signal.

20. The flip-flop circuit of claim 11, wherein the feedback path comprises:
a NOR gate including input terminals to receive the data signal and the output signal, and including an output terminal to provide the feedback signal to the second logic gate.

* * * * *